United States Patent
Shiomi et al.

[11] Patent Number: 5,976,909
[45] Date of Patent: Nov. 2, 1999

[54] METHOD OF FORMING DIAMOND HEAT SINK COMPRISING SYNTHETIC DIAMOND FILM

[75] Inventors: Hiromu Shiomi; Hideaki Nakahata; Yoshiki Nishibayashi; Shin-ichi Shikata, all of Itami, Japan

[73] Assignee: Sumitomo Electric Industries, Ltd., Japan

[21] Appl. No.: 08/815,781

[22] Filed: Mar. 12, 1997

Related U.S. Application Data

[62] Division of application No. 08/509,569, Jul. 31, 1995, Pat. No. 5,663,595.

[30] Foreign Application Priority Data

Aug. 3, 1994 [JP] Japan ................................ 6-182380

[51] Int. Cl.⁶ .................... H01L 23/367; H01L 23/373; H01L 23/38
[52] U.S. Cl. .................... 438/105; 438/54; 438/584; 257/77; 257/719
[58] Field of Search ...................... 438/54, 105, 603, 438/680, 584; 257/712, 707, 76, 77, 706, 713, 719, 720, 414; 338/22

[56] References Cited

U.S. PATENT DOCUMENTS

| | | | |
|---|---|---|---|
| 3,872,496 | 3/1975 | Potter | 257/720 |
| 5,022,928 | 6/1991 | Buist | 136/212 |
| 5,132,749 | 7/1992 | Nishibayashi et al. | 357/15 |
| 5,144,380 | 9/1992 | Kimoto et al. | 257/77 |
| 5,252,840 | 10/1993 | Shiomi et al. | 257/77 |
| 5,309,000 | 5/1994 | Saito et al. | 257/76 |
| 5,317,302 | 5/1994 | Yamazaki | 338/225 |
| 5,391,914 | 2/1995 | Sullivan et al. | 257/77 |
| 5,622,586 | 4/1997 | Vaitkus et al. | 156/247 |

FOREIGN PATENT DOCUMENTS

| | | |
|---|---|---|
| 61-253842 | 11/1986 | Japan . |
| 63-184304 | 7/1988 | Japan . |
| 2-270304 | 11/1990 | Japan . |
| 3-024775 | 2/1991 | Japan . |
| 4-312982 | 4/1992 | Japan . |
| 5-67711 | 3/1993 | Japan . |
| 6-0152045 | 10/1995 | Japan . |

*Primary Examiner*—John F. Niebling
*Assistant Examiner*—Ha Tran Nguyen
*Attorney, Agent, or Firm*—Pennie & Edmonds LLP

[57] ABSTRACT

A diamond heat sink is disclosed in this invention. The diamond heat sink has a support layer consisting of substantially undoped vapor phase synthetic diamond, a heat sensitive layer consisting of doped vapor phase synthetic diamond formed on the surface of the support layer; an insulation layer consisting of substantially undoped vapor phase synthetic diamond formed on a predetermined region of the heat sensitive layer; and an electrode formed on the heat sensitive layer. The electrode typically consists of a metal, preferably Ti/Mo/Au or Ti/Pt/Au. The diamond heat sink of the present invention may further include a highly-doped layer for creating Ohmic contacts with the metal electrode, which is made of the vapor phase synthetic diamond having high impurity levels, and which is disposed between the metal electrode and the heat sensitive layer.

7 Claims, 8 Drawing Sheets

METHOD OF FORMING DIAMOND HEAT SINK COMPRISING SYNTHETIC DIAMOND FILM

This is a division of application Ser. No. 08/509,569, filed Jul. 31, 1995, now U.S. Pat. No. 5,663,595.

BACKGROUND OF THE INVENTION

1. Field of the Invention

The present invention is directed to a diamond heat sink having an excellent heat release characteristics, which incorporates a thermistor or a cooling element with higher thermal response, and is also directed to a method of manufacturing it.

2. Related Background Art

Diamond is a suitable material for heat sink, because diamond has excellent thermal conductivity of more than 2,000[W/m·K]. Further, since diamond can acquire the characteristic of semiconductor material when impurities are doped into the diamond, the resultant doped diamond can be employed as a thermistor material which has an capabilities for the use at elevated temperature and has a quick thermal response characteristics.

Japanese Patent Laid-open No. 63-184304 discloses a thermistor made with diamond. A semiconductor diamond film is formed on a substrate by vapor phase synthesis. The semiconductor diamond film of this reference serves as a heat sensitive film. Ohmic electrodes are formed on the heat sensitive film. The resistivity of the heat sensitive film are measured through these Ohmic electrodes to determine the temperature of the heat sensitive film. Examples of the available substrates on which the heat sensitive film is formed include single crystal diamond substrate, metal having a high melting point and a high thermal conductivity, semiconductor, and other compound(s) thereof.

In Japanese Patent Laid-open No. 5-67711 discloses a thermistor made of diamond to be integrated with a heat sink made of diamond, and the manufacturing method of the thermistor-integrated heat sink. According to the construction of the thermistor with this manner, the semiconductor diamond film as the heat sensitive film is formed on a predetermined region of a heat sink material by the vapor phase synthesis, and metal electrodes are then formed on the heat sensitive film. A metallized film is also formed on the surface of the heat sink material next to the thermistor. The exothermal elements such as diode and FET are seated onto the metallized film for their temperature to be measured. The exotherms from the element on the metallized film is conducted to the thermistor through the heat sink material, and the temperature of the element can be measured. Japanese Patent Laid-open No. 5-67711 also shows another thermistor-integrated heat sink. The semiconductor diamond film as the heat sensitive film is formed on the entire surface of the heat sink material and metal electrodes are formed onto the heat sensitive film. A metallized film is formed onto the surface of the heat sensitive film between the metal electrodes, and the exothermal elements are seated onto the metallized film. In both of the thermistor-integrated heat sinks of the Japanese Patent Laid-open No. 5-67711, single crystal diamond, metals having high melting point and higher thermal conductivity (or refractory metals with higher thermal conductivity), semiconductor or other compound(s) thereof are used for the heat sink material.

As mentioned above, in Japanese Patents Laid-open Nos. 63-184304 and 5-67711, the single crystal diamonds are employed as the substrate of the thermistor of the former and as the heat sink material of the thermistor-integrated heat sink of the latter, respectively. Single crystal diamonds of a consistent quality can be obtained through artificial synthetic method under extra high pressure, which are still costly.

When the vapor phase synthesis is applied to obtain the diamond heat sink, a thicker diamond would be required for the substrate and the heat sink, because of insufficient performances of the diamonds made via vapor phase synthesis. Further, since the vapor phase synthetic diamond is polycrystalline, the surface of the diamond would be considerably rough. Thus, the rough surface of the synthetic diamond needs to be polished and made flat to mount the exothermal elements. However, since diamond is an extremely hard material, the polishing process for synthetic diamond includes significant difficulties.

In the heat sink construction of Japanese Patent Laid-open No. 5-67711 where the thermistor and the exothermal element are arranged in parallel on the heat sink material, the exotherms from the exothermal element is transferred through heat sink material to the thermistor. Thus, the heat would be detected with some delay, and some of the heat would be absorbed by the heat sink material in the heat transfer process from the exothermal element to the thermistor. Therefore, the thermistor-integrated heat sinks of the above references have insufficient abilities to precisely detect and control a temperature of the mounted exothermal element.

U.S. Pat. No. 5,022,928 discloses a film-shaped thermoelectric heat pump of the Peltier element type in which $Bi_2 Te_2$ etc. are laminated onto a substrate. This patent, however, not directed to the improvement of heat transfer. In addition, the patent does not describe the point of quick response required when it is used as a heat sink.

Consequently, it is desirable to present a heat sink with a quick response which comprises a synthetic diamond made via a vapor phase synthesis.

SUMMARY OF THE INVENTION

The present invention satisfies the above requirements. A diamond heat sink of the present invention comprises: a support layer consisting of substantially undoped vapor phase synthetic diamond; a heat sensitive layer consisting of doped vapor phase synthetic diamond formed on the surface of the support layer; an insulation layer consisting of substantially undoped vapor phase synthetic diamond formed on a predetermined region of the heat sensitive layer; and an electrode formed on the heat sensitive layer. The electrode typically consists of a metal, preferably Ti/Mo/Au or Ti/Pt/Au.

The diamond heat sink of the present invention may further include a highly-doped layer for creating Ohmic contacts with the metal electrode, which is made of the vapor phase synthetic diamond having high impurity levels, and which is disposed between the metal electrode and the heat sensitive layer.

The diamond heat sink of the present invention may further include a metallized layer formed onto the insulation layer. The metallized layer may be a single layer of Ti/Mo/Au, Ti/Pt/Au or Au with Sn, or multiple layers thereof.

Each of the above diamond heat sinks may further include a cooling element formed on the reverse side of the support layer.

The cooling element may be a Peltier element comprising: a first metal layer formed on the reverse side of a support layer; a p-type semiconductor layer consisting of a diamond doped with a p-type impurity which contacts to the first metal layer; an n-type semiconductor layer consisting of a diamond doped with an n-type impurity which contacts to the first metal layer; a second metal layer which contacts to the p-type semiconductor layer; and a third metal layer which contacts to the n-type semiconductor layer. The Peltier element may consist of plurality of Π-shaped submodules, each of which is connected in series to form a Peltier module.

The method for manufacturing the diamond heat sink according to the present invention comprises the following steps of: forming a substantially undoped diamond on a substrate via vapor phase synthesis so that an insulation layer of the undoped diamond is formed on the substrate; forming a doped diamond on the insulation layer via vapor phase synthesis so that a heat sensitive layer of semiconductor diamond is formed on the insulation layer; forming a substantially undoped diamond on the heat sensitive layer via vapor phase synthesis so that a support layer of undoped diamond is formed on the heat sensitive layer; removing the substrate so that the substantially flat surface of the insulation layer is exposed; selectively removing the predetermined part of the exposed surface of the insulation layer so that the predetermined area of the surface of the heat sensitive layer is further exposed; and forming an electrode on the surface of the exposed heat sensitive layer.

The method for manufacturing the diamond heat sink according to the present invention may further comprise the step of forming a metallized layer on the other surface of the insulation layer so that the metallized layer is disposed on the insulation layer surface opposite the heat sensitive layer.

The exotherms from the exothermal element such as diode and FET which is positioned on the insulation layer is transferred via the insulation layer to the heat sensitive layer contacting the insulation layer, then is conducted to the support layer contacting the heat sensitive layer, and is finally released at the support layer. Since each of the insulation layer, heat sensitive layer and the support layer consists of diamond having excellent heat conductivity, the exotherms from the exothermal element on the insulation layer or the metallized layer on the insulation layer is instantly conducted to the support layer. In addition, since the thermal response rate of the thermistor comprising the diamond heat sensitive layer is excellent, the resistance of the heat sensitive layer between the electrodes quickly responds to the temperature of the element on the insulation layer. Since the thermal capacity of the insulation layer is small, most of the exotherms from the exothermal element on the insulation layer is transferred to the heat sensitive layer. The contact resistance between the electrodes and the heat sensitive layer can be reduced, by means of highly-doped layer disposed between the electrodes and the heat sensitive layer. Therefore, a heat sink with higher response characteristic can be produced.

A smooth surface of the insulation layer can be obtained without any difficulties in the manufacturing processes, by means of removing the substrate to expose the smooth surface of the insulation layer, which is originally formed or deposited on the smooth surface of the substrate. Therefore, the smooth surface of the insulation layer which consists of the vapor phase synthetic polycrystal diamond can be obtained and utilized for the surface on which the exothermal element is mounted. Thus, a polishing process can be avoided for the manufacture of a heat sink using vapor phase synthetic diamond.

Further, for another heat sink according to the present invention which further has a metallized layer on the insulation layer, an exothermal element such as diode and FET is seated on the metallized layer so that the exotherms from the exothermal elements is transferred via the metallized layer and the insulation layer.

The surface of the insulation layer of the alternative diamond heat sink according to the present invention may be processed to have surface shape corresponding to the shape of the exothermal element to be mounted, so that the exothermal element would fit to the processed surface of the insulation layer. A metallized layer can further be formed on or covered to the processed insulation layer, having the equivalent shape or pattern of the surface of the insulation layer. The exotherms from the exothermal element can be sufficiently conducted to the insulation layer of the alternative heat sinks according to the present invention, because the exothermal element can fit to the processed surface of the insulation layer or metallized layer on the insulation layer so that the contacting area between the insulation layer and the element, or thermal conducting area, is sufficiently large. The sufficiently large thermal conducting area would combine with the sufficient endothermal capacity of the diamond heat sink to give excellent heat transfer performances. The alignment for mounting the exothermal element on the processed surface can also be suitably carried out.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

EXAMPLE 1

Each of the FIGS. 1A to 1G is a cross sectional view of a heat sink, showing a manufacturing steps of a diamond heat sink of the first embodiment of the present invention. The diamond heat sink manufactured in the following manner.

Figure 1A:
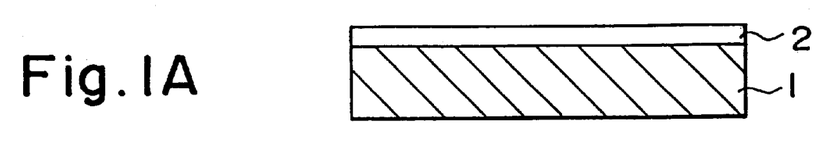
FIGS. 1A–1G show a cross sectional view of a diamond heat sink containing a thermistor of a first embodiment, respectively. The figures illustrates the manufacturing steps of the first embodiment according to the present invention.

First, a substantially undoped diamond was deposited on a flat surface of a silicon (Si) substrate 1 via vapor phase synthesis to form insulation layer 2 (see FIG. 1A). The deposition was carried out by microwave plasma chemical vapor deposition (CVD) using microwave of 2.45 GHz, and under the synthesis condition I shown in Table 1.

TABLE 1

| SYNTHESIS CONDITIONS | I (undoped) | II (doped) | III (highly doped) |
| --- | --- | --- | --- |
| hydrogen (sccm) | 200 | 200 | 200 |
| methane (sccm) | 1 | 1 | 1 |
| 1000 ppm diboran (sccm) | 0 | 0.02–1 | 10 |
| microwave power (W) | 400 | 400 | 400 |
| pressure (Torr) | 40 | 40 | 40 |
| substrate temp. (° C.) | 930 | 930 | 930 |

A mixed gas consisting of hydrogen with a flow rate of 200 sccm and methane with a flow rate of 1 sccm was introduced into the CVD chamber under the chamber pressure of 40 Torr. The plasma was created in the processing chamber by applying 400 W microwave power. The undoped diamond, thus, deposited on the surface of the Si substrate 1 at the temperature of 930° C. to form the insulation layer 2. The insulation layer 2 has the thickness of 5 μm. The level of impurities was approximately equal to or less than $10^{14}$ cm$^{-3}$, which is regarded as substantially undoped.

Figure 1B:
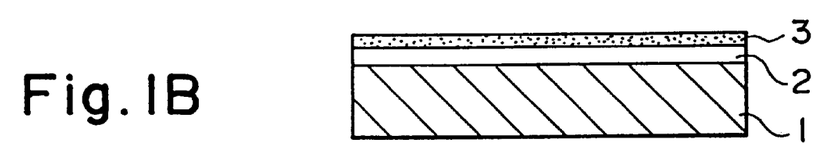

Next, semiconductor diamond was deposited on the surface of the insulation layer 2 via microwave plasma CVD to form a heat sensitive layer 3 (FIG. 1B). The deposition was carried out according to the synthesis conditions II of Table 1, where boron is doped into the diamond of the layer 3. The mixed gas of a 1000 ppm diboran (flow rate was from 0.02 to 1 sccm), hydrogen (flow rate of 200 sccm) and methane (flow rate of 1 sccm) was introduced into the CVD chamber to create the chamber pressure of 40 Torr. Then the plasma was created by applying 400 W microwave power. Semiconductor diamond was thus deposited on the insulation layer 2 at the temperature of 930° C., and the heat sensitive layer 3 was formed on the insulation layer 2. The thickness of the heat sensitive layer 3 was 2 μm, and the level of impurities of the heat sensitive layer was approximately from $10^{16}$ to $10^{19}$ cm$^{-3}$.

Figure 1C:
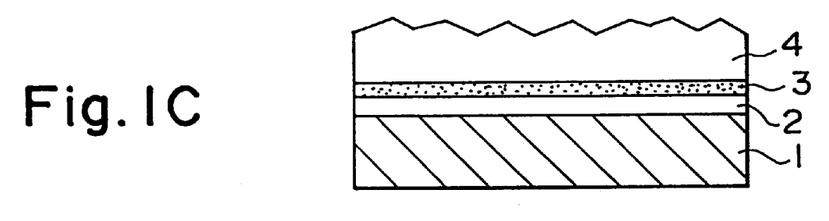

Then, a substantially undoped diamond was deposited on the heat sensitive layer 3 via microwave plasma CVD to form a support layer 4 (FIG. 1C). The deposition process was carried out according to the synthesis conditions I of Table 1. The thickness of the support layer 4 was up to 100 μm. Since the diamond layer deposited by CVD is polycrystal, the exposed surface was considerably rough, as shown in the FIG. 1C. The impurity level of the diamond of the support layer 4 was approximately equal to or less than $10^{14}$ cm$^{-3}$.

Figure 1D:
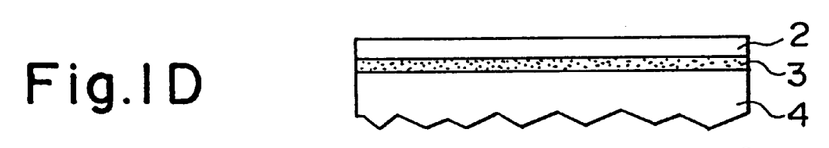

Then, the Si substrate 1 was removed by etching process using the mixture of fluoric acid and nitric acid at the ratio of 1:1, and the surface of the insulation layer 2 opposite the heat sensitive layer 3 was thus exposed (FIG. 1D). At this stage, the support layer 4 positioned on the upper side is turned upside down to be positioned on the lower side or bottom, and the insulation layer 2 is then placed on the upper side or top.

Figure 1E:
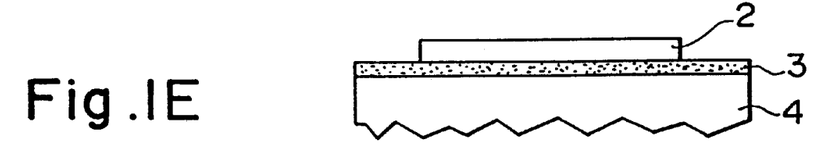

Further, a aluminum mask was formed on the predetermined portion around the center of the exposed surface of the insulation layer 2. The insulation layer 2 other than the portion covered with the mask, was removed by etching. This diamond etching process was carried out in accordance with the conditions indicated in the Table 2.

TABLE 2

| 02/Ar | Flow rate | RF power at 1.356 MHz | etch rate |
| --- | --- | --- | --- |
| 1/99 | 100 sccm | 100 W | 15 nm/min. |

A mixed gas containing 1% oxygen and 99% argon was introduced into the chamber at a flow rate of 100 sccm and the plasma was made by applying RF power of 1.356 MHz and 100 W. Then only the uncovered portion of the insulation layer 2 was thus selectively etched at an etching rate of 15 nm/min (FIG. 1E).

Figure 1F:
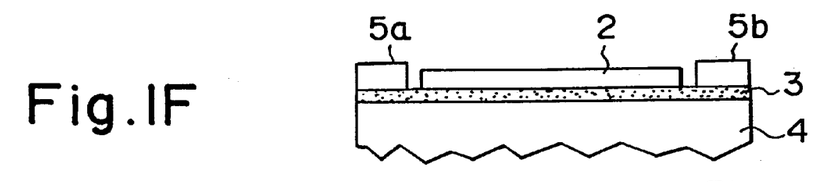

Then, a pair of electrodes 5a and 5b were formed onto the exposed surface of the heat sensitive layer 3, which create an Ohmic contact to the electrodes (FIG. 1F). The electrodes were made of Ti/Mo/Au metal. The contact resistance between the electrodes 5a, 5b and the heat sensitive layer 3 was sufficiently low. It was found according to the further investigation that the sufficiently low contact resistance was maintained to be substantially constant at the elevated temperature.

Figure 1G:
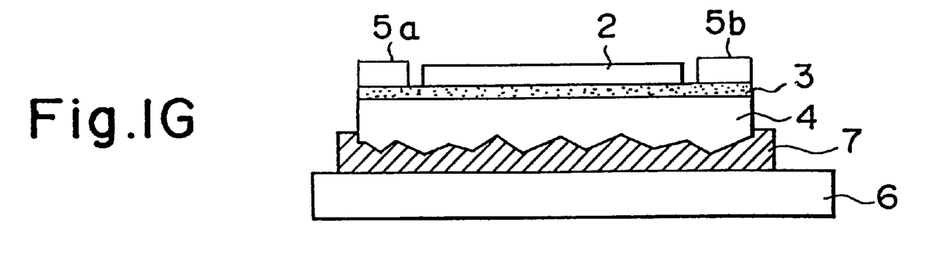

Finally, a copper support table 6 is fixed over the rough surface of the support layer 4 via silver solder 7 (FIG. 1g).

A heat from the exothermal element such as semiconductor laser diode was placed on the insulation layer 2. The exotherms from the element on the insulation layer 2 is transferee by conduction via insulation layer 2 to the heat sensitive layer 3. The heat was then transferred to the support layer 4 and the copper support table 6. Since the insulation layer 2, heat sensitive layer 3 and the support layer 4 are made of diamond having excellent heat conductivity, the heat from the element on the insulation layer 2 would be quickly transferred by conduction to the support layer 4. The heat would be then quickly released from the heat sink consisting of the support layer 4 and the copper support table 6. Since the thermal response rate of the thermistor is high, the resistance between the electrodes 5a and 5b and the heat sensitive layer 3 promptly varies to the resistance corresponding to temperature of the element positioned on the insulation layer 2. Since the thermal capacity of the insulation layer 2 is small, most of the heat from the exothermal element on the insulation layer 2 would be transferred to the heat sensitive layer 3. Therefore, the temperature of the element on the insulation layer 2 is highly precisely and quickly measured by applying electrical current between the electrodes 5a and 5b and detecting resistance value across the heat sensitive layer 3. At the same time, the exotherms from the element is conducted to the support layer 4 and the support table 6 and is then quickly released.

In the manufacturing process of the diamond heat sink of this embodiment, the synthetic diamond was deposited onto the flat and even surface of the substrate to form the insulation layer 2. And the Si substrate 1 was then removed and the smooth surface of the insulation layer 2 was exposed. Thus, the smooth surface of the insulation layer 2 can be employed as the surface on which the element is mounted, by reversing the position at the step shown in FIG. 1D. Therefore, the synthetic diamond can be used for manufacturing the thermistor without any necessity for polishing the rough surface of vapor phase synthetic diamond. The manufacturing cost is thus highly reduced.

The further investigation was carried out to determine characteristics of thermistor by varying doping level of the heat sensitive layer 3. The result is shown in Table 3. The variation of the boron level was accomplished by varying the concentration of diboran gas in the gas mixture including hydrogen and methane in the synthesis conditions II of Table 1.

TABLE 3

| THERMISTOR | I | II | III |
|---|---|---|---|
| Boron conc. (ppm) | 20 | 100 | 1,000 |
| Resistivity at room temp. (Ω) | 7.2 M | 240 k | 720 |
| Temp. available for use (° C.) | 0–800 | 0–800 | 0–800 |
| B constant (K) | 4,990 (0.43 eV) | 3,940 (0.34 eV) | 2,550 (0.22 eV) |
| Resistivity changing rate (Ω/° C.) | 399 k | 10.5 k | 20.4 |

The thermistor I was obtained when doped diamond was deposited using 20 ppm diboran gas in the gas mixture to form heat sensitive layer 3. The thermistor II was obtained by using 100 ppm diboran gas, and the thermistor III by using 1,000 ppm diboran gas, respectively.

Since the thermistor and the heat sink is made of diamond, the thermistor can be used at high temperature from 0° C. to 800° C. The thermistor III is the thermistor of the present embodiment, the standard resistance value of which at room temperature was relatively low (720 Ω). The thermistor constant B was 2,550 K and the activation energy is 0.22 eV, and thus the changing rate of the thermistor resistance at room temperature was 20.4 Ω °C$^{-1}$.

The standard resistance value at room temperature would rise as the boron level is lowered. That is, the standard resistance value in the thermistor II using 100 ppm diboran gas was 240 KΩ, and the thermistor I using 20 ppm diboran gas was 7.2 MΩ. The range of temperature at which the thermistor can be used is fixed from 0° C. to 800° C., regardless of the variation of the boron doping level. The thermistor constant B would become larger as the boron level is lowered. That is, the B constant of the thermistor II was 3,940 K and the activation energy was 0.34 eV, and the constant B of the thermistor I was 4,990 K and the activation energy was 0.43 eV. Thus, the resistance changing rate at room temperature would also become larger as the boron level is lowered. The thermistor II which was formed using 100 ppm diboran gas has the changing rate of 10.5 KΩ °C.$^{-1}$, and the thermistor I of 20 ppm diboran has the changing rate of 399 KΩ °C.$^{-1}$.

Therefore, a suitable thermistor can be selected from thermistor I, II and III, according to the operating conditions.

The time constant for giving the rate of thermal response of the thermistor, in which the heat sensitive layer 3 was formed by using the mixed gas at 100 ppm diboran, was measured, and the value of the time constant was 0.05 second. This means that the thermistor has an ability to achieve the temperature change in 63.2% of the temperature difference $(t_1-t_0)$ in 0.05 second, when stepwise temperature difference to the temperature $t_1$ is given to the thermistor from the initial temperature of $t_0$.

EXAMPLE 2

Figure 2:
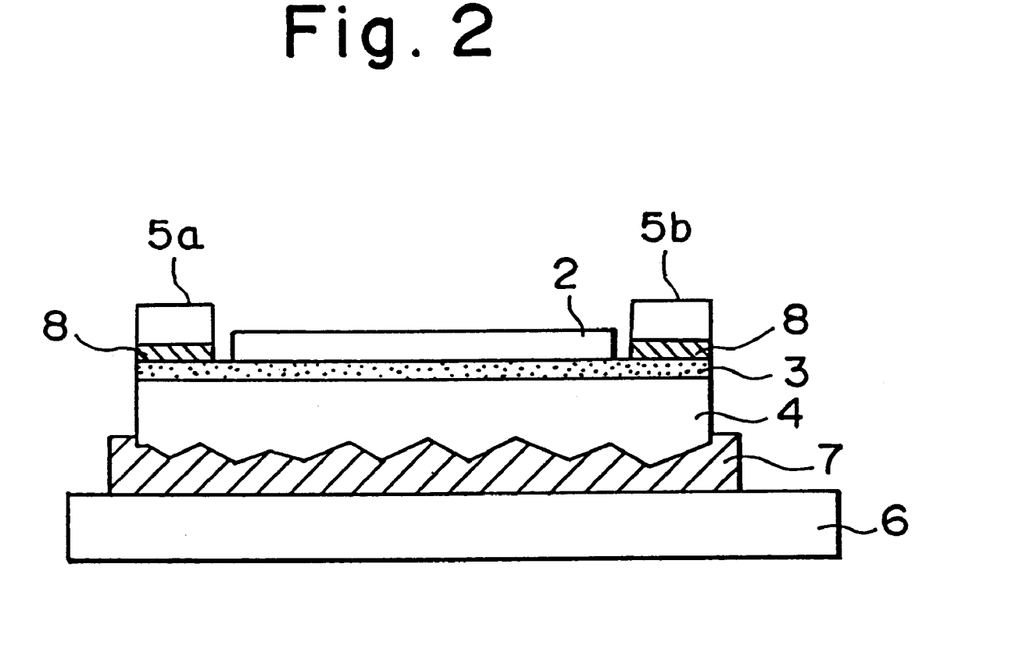
FIG. 2 illustrates a cross sectional view of a diamond heat sink containing a thermistor of a second embodiment according to the present invention.

Now, a diamond heat sink of the second embodiment of the present invention will be described. FIG. 2 is a cross sectional view showing the diamond heat sink of the present embodiment.

The diamond heat sink of the second embodiment further has a highly doped layer 8 for Ohmic contact, which is disposed between the heat sensitive layer 3 and the electrodes 5a and 5b. The highly doped layer 8 consists of diamond which includes impurity at higher level. The highly doped diamond was deposited on the heat sensitive layer 3 by microwave plasma CVD to form the highly doped layer 8, according to the diamond synthesis conditions III of Table 1.

After the patterning of the insulation layer 2 by photolithography, as shown in FIG. 1E, a SiO$_2$ layer was formed on entire surface of the substrate 1. The predetermined portion of the SiO$_2$ layer was selectively removed by etching, and a surface of the heat sensitive layer 3 underlying the etched portion was partly exposed. Next, under the synthesis conditions III in Table 1, the gas containing 1,000 ppm diboran at the flow rate of 10 sccm as well as hydrogen at 200 sccm flow rate and methane at 1 sccm flow rate was introduced into the CVD chamber under the pressure of 40 Torr. The plasma was created by applying 2.45 GHz and 400 W microwave power, and doped diamond was deposited on the surface of the substrate by microwave plasma CVD at the temperature of 930° C. Such a vapor-phase growth would occur only on the surface of the heat sensitive layer 3 made of semiconducting diamond layer exposed on the electrode-forming portion, and would not occur on the SiO$_2$ layer. Thus, the diamond layer including high level of boron was selectively deposited on the diamond surface, and the highly doped layer 8 for Ohmic contact was formed only on the electrode-forming portion as shown in FIG. 2. After the electrodes 5a and 5b were formed on the highly-doped layer 8, the SiO$_2$ layer was removed by dry etching. Then, the copper support table 6 was fixed over the support layer 4, and the heat sink containing the thermistor is thus completed.

In the heat sink of this embodiment, since the highly doped layer 8 was disposed between the electrodes 5a and 5b and the heat sensitive layer 3, the contact resistance of the electrodes 5a and 5b with the heat sensitive layer 3 was effectively reduced. Thus, the standard resistance of the thermistor was also reduced as shown in Table 4.

TABLE 4

| THERMISTOR | I | II | III |
|---|---|---|---|
| Boron conc. (ppm) | 20 | 100 | 1,000 |
| Resistivity at room temp. (Ω) | 6.0 M | 200 k | 700 |
| Temp. available for use (° C.) | 0–800 | 0–800 | 0–800 |
| B constant (K) | 4,990 (0.43 eV) | 3,940 (0.34 eV) | 2,550 (0.22 eV) |
| Resistivity changing rate (Ω/° C.) | 399 k | 10.5 k | 20.4 |

The Table 4 shows the characteristics of the different thermistors of different boron doping levels layer as shown in Table 3. The thermistor III shown in table 4 corresponds to the thermistor of the second embodiment, and its standard resistance value at room temperature was as low as 700 Ω. The standard resistance value of the thermistor characteristic II at 100 ppm diboran is 200 KΩ, and the standard resistance value of the thermistor characteristic 1 at 20 ppm diboran is 6.0 MΩ. All of the standard resistance values at room temperature were lower than the standard resistance value shown in Table 3.

The range of temperature at which the thermistor can be used, the B constant, and the changing rate of resistance are the same as those in Table 3.

EXAMPLE 3

The heat sink of the present embodiment comprises a Peltier element as well as a thermistor. FIGS. 3A to 3D illustrate the manufacturing process of the heat sink which comprises the thermistor and the Peltier element.

It is known that the thermoelectric power of a semiconductor material, which is the inverse of the Peltier Effect, is proportional to the band gap of the semiconductor material ("ELECTRONS IN SOLIDS—An Introductory Survey Second Edition", Richard H. Bube, pp.191–192, which is hereby incorporated by reference).

The reference also teaches that excellent thermal conductivity of diamond would have affect creating temperature difference in the Peltier element. However, the excellent Peltier Effect of the diamond Peltier element would compensate the disadvantage of difficulty on creating temperature difference, and therefore the diamond Peltier element can successfully transfer the exotherms from the exothermal element.

The insulation layer 2 made of undoped vapor phase synthetic diamond, the heat sensitive layer 3 of semiconducting vapor phase synthetic diamond, and the support layer 4 of undoped vapor phase synthetic diamond were formed on the Si substrate 1 in order, as in the manufacturing process of the first embodiment (FIGS. 1A, 1B and 1C).

Figure 3A:
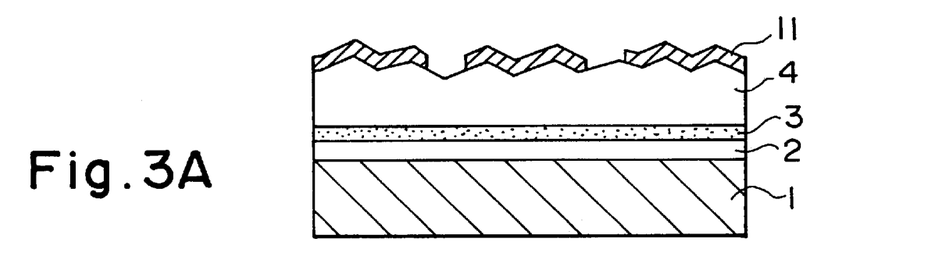
FIGS. 3A–3D show a cross sectional view of a diamond heat sink containing a thermistor and a Peltier element of a third embodiment, respectively. The figures illustrates the manufacturing steps of the third embodiment according to the present invention.
Figure 3B:
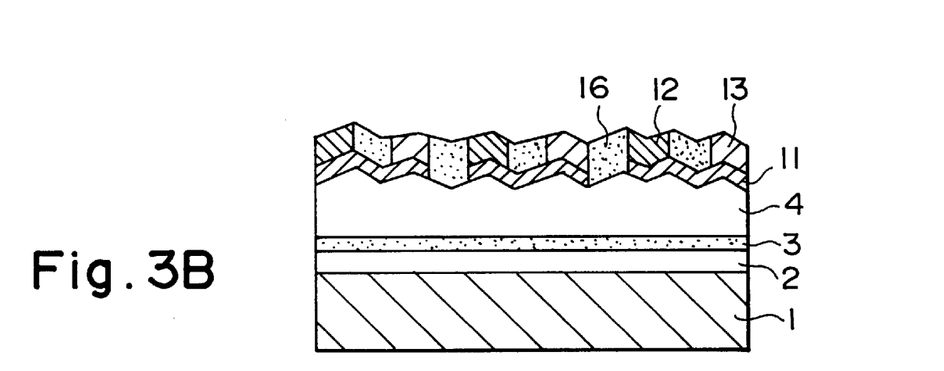
Figure 3C:
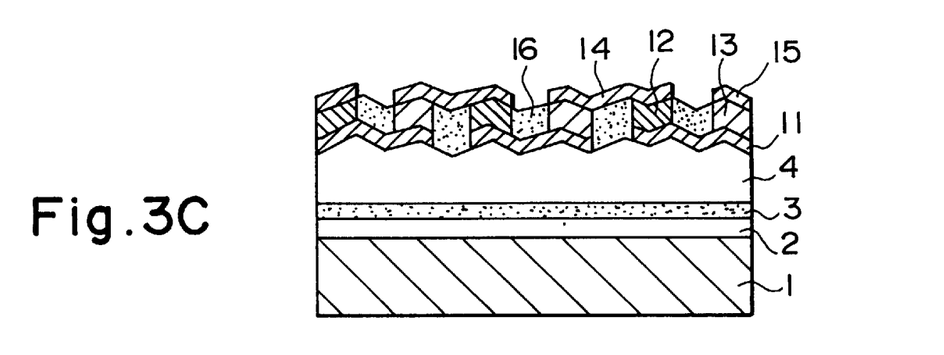
Figure 3D:
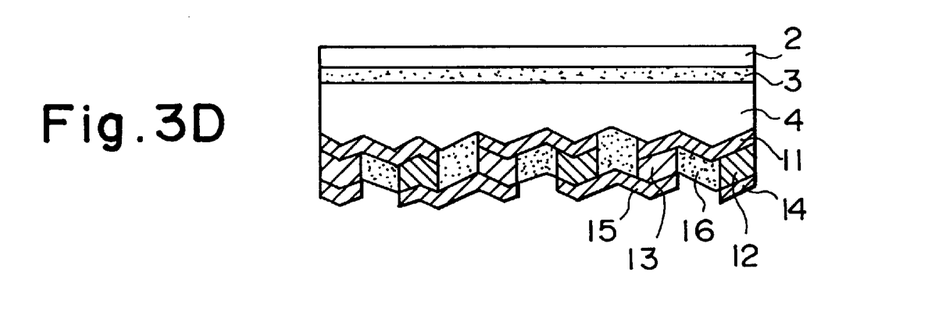

Next, a metal layer was deposited on the rough surface of the support layer 4 and the patterning was made on the surface of the metal layer. A first metal layer 11 is selectively formed on the support layer 4 (FIG. 3A). Then, a p-type semiconductor layer 12 and an n-type semiconductor layer 13 was selectively deposited on the first metal layer 11 by selective CDV method, and the each of semiconductor layers 12 and 13 has a contact to the first metal layer 11 at one end (FIG. 3B). The semiconductor layers 12 and 13 consists of semiconductor materials of II–VI compound such as bismuth-tellurium semiconductor. An insulation layer 16 was embedded between the p-type semiconductor layer 12 and the n-type semiconductor layer 13, in order to electrically insulate and isolate each of the layers 12 and 13. Then, another metal layer was deposited on the entire surface of the substrate, and the patterning was made on the surface of the metal layer. A second metal layer 14 and a third metal layer 15 were selectively formed to make contact with the p-type semiconductor layer 12 and n-type semiconductor 13 at the other end, respectively (FIG. 3C). The Peltier element of the present embodiment comprises II-shaped submodule units which consists of the first metal 11, the p-type semiconductor layer 12, the n-type semiconductor layer 13, the second metal layer 14 and the third metal layer 15. Each of the submodules are connected in series, and the module of the Peltier element is composed of the submodules connected in series. Then, the Si substrate 1 was removed by etching using the mixed liquid of fluoric acid and nitric acid at the ratio of 1:1, to obtain a smooth surface of the insulation layer 2. The insulation layer 2 is then reversed upside down, and the smooth surface of the insulator layer is positioned on the upper face (FIG. 3D).

The patterning was then made on the exposed surface of the insulation layer 2 as in the first embodiment, and the electrodes 5a and 5b were formed in contact with the exposed heat sensitive layer 3 (FIGS. 1E and 1F). As a result, an excellent diamond heat sink containing the thermistor and the Peltier element shown in FIG. 4 was obtained.

Figure 4:
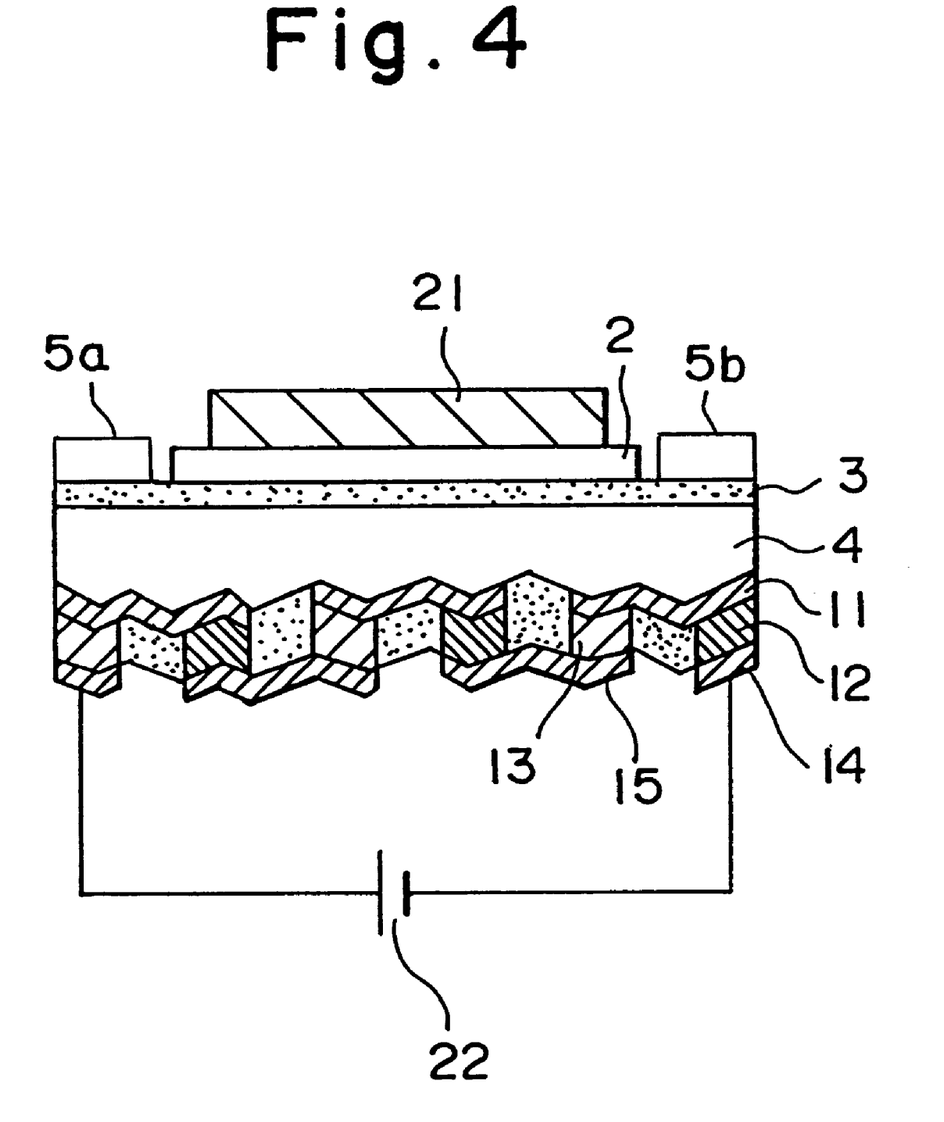
FIG. 4 also illustrates a cross sectional view of the diamond heat sink containing the thermistor and the Peltier element of the third embodiment.

As shown in the FIG. 4, an exothermal element 21 to be measured was placed on the surface of the insulation layer 2. A power source 22 was connected between terminals of the Peltier element, and the electrical current was applied in each of the submodules connected in series. Endotherms was caused in the upper face of the Peltier element, which comprises the contact portion between the p-type semiconductor layer 12 and the first metal layer 11 and the contact portion between the n-type semiconductor layer 13 and the first metal layer 11, when electrical current was applied. Exotherms was also caused in the lower face of the Peltier element, which comprises the contact portion between p-type semiconductor layer 12 and the second metal layer 14 and the contact portion between the n-type semiconductor layer 13 and the third metal layer 15. Consequently, since the Peltier element as cooling element was formed on the reversed side of the support layer 4, the exotherms from the exothermal element was promptly transferred by conduction to the support layer 4, and quickly released by the Peltier element.

The exotherms from the exothermal element 21 positioned on the insulation layer 2 was promptly transferred through the insulation layer 2 and the heat sensitive layer 3 to the support layer 4 as in the first embodiment. The heat reached to the support layer 4 would be promptly absorbed into the upper face of the Peltier element, and then released into the atmosphere at the lower face of the Peltier element. As described earlier in the description on the first embodiment, the temperature of the exothermal element 21 was instantly and precisely detected by the thermistor which consists of the heat sensitive layer 3 and the electrodes 5a and 5b. Thus, the heat absorption and the heat releasing by the Peltier element can be precisely and simultaneously controlled by controlling the electrical current applied to the Peltier element to the level corresponding to the measured element temperature. The temperature of the element 21 placed on the insulation layer 2 can thus be precisely set to the desired temperature without considerable delay.

The heat sink of the present embodiment is very useful for the use of controlling the operation of electrical devices. For example, when the exothermal element (device) 21 is a semiconductor laser diode (LD), the temperature of the LD 21 is simultaneously detected by the thermistor at high thermal response rate, and is quickly cooled to stabilize temperature of the LD 21 by the Peltier element. As a result, stable operation of the laser diode was achieved to emit a light with a constant light strength and a constant wavelength.

In the manufacturing method of the diamond heat sink of the third embodiment, the support layer 4 was first formed on the heat sensitive layer 3, the Peltier element was formed on the support layer 4, then Si substrate 1 was removed, and eventually the flat, even and smooth surface of the insulation layer 2 was exposed. Therefore, a smooth surface of the synthetic diamond can be obtained for being mounted a exothermal element without difficult polishing process. The heat sink containing the thermistor and the Peltier element can be thus obtained at low cost.

In the third embodiment, the electrodes 5a and 5b directly contact the surface of the heat sensitive layer 3. However, a highly doped layer for forming Ohmic contacts may be disposed between the heat sensitive layer 3 and the electrodes 5a and 5b as in the second embodiment. In this case, the contact resistance of the electrodes 5a and 5b can be maintained to be low as in the second embodiment.

EXAMPLE 4

Figure 5A:
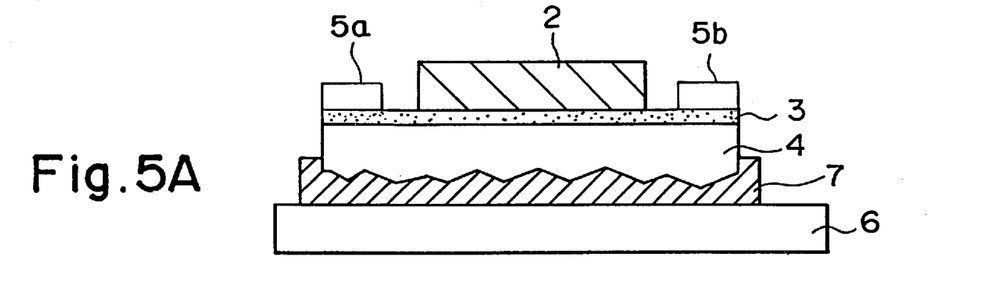
FIGS. 5A–5C show a cross sectional view showing a diamond heat sink containing a thermistor of a fourth embodiment, respectively. The figures illustrates the manufacturing steps of the fourth embodiment according to the present invention.
Figure 5B:
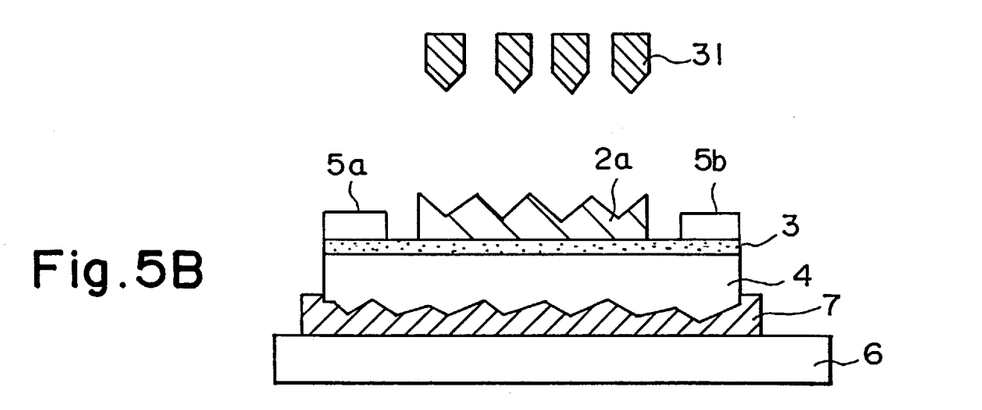
Figure 5C:
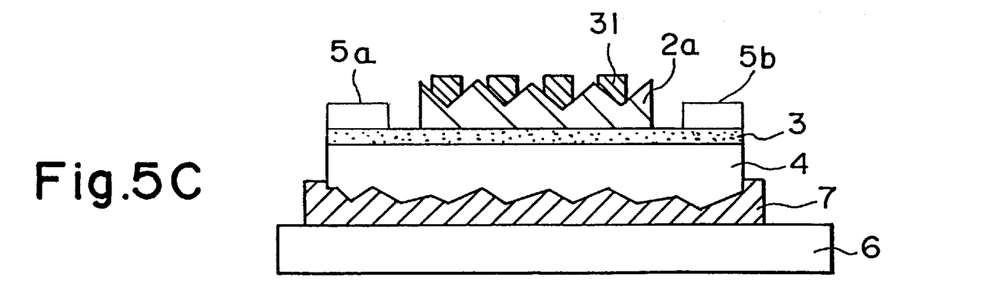

FIGS. 5A to 5C shows a cross sectional view of the diamond heat sink of this embodiment. A heat sink shown in FIG. 5A is the heat sink containing a thermistor obtained in the first embodiment. In the fourth embodiment, as shown in FIG. 5B, the surface of the insulation layer 2 was further processed to fit the shape of an exothermal element to be mounted 31. The exothermal elements 31 was mounted on the processed insulation layer 2 and the exothermal element could fit to the processed surface of the insulation layer, as shown in the FIG. 5C. Therefore, the contacting area between the insulation layer 2a and the element 31 was made as large as possible. Since the heat transfer area between the element 31 and the insulation layer 2a is sufficiently large, the exotherms from the element 31 would be more efficiently transferred to the insulation layer 2a. The heat from the element 31 was thus transferred to the support layer 4 in shorter time, and the heat release effect of the heat sink was more enhanced.

When the element 31 is, for example, a LD (laser diode), most of the exotherms are from the active layer of the laser diode. The exotherms from the LD can be regarded as a exotherm from a point source, as described in the reference;page 442 to page 447: "Journal of LIGHTWAVE TECHNOLOGY vol. 11 No. 3 MARCH 1993".

Theoretical analysis of heat release was carried out by a computing simulation assuming a LD as a point heat source. It was confirmed by the theoretical analysis that the heat release effect was highly improved, when the surface of the insulation layer 2a was processed to fit the exothermal element 31 and the distance between the active layer of the LD and the surface of the insulation layer 2a was shortened as much as possible. Experiments using the LD as the element 31 were also conducted, and the threshold current for thermorunaway of the LD which was mounted on the processed surface of the insulation layer was 50% larger than the case where the surface of the insulation layer 2 was flat and not processed.

Figure 6:
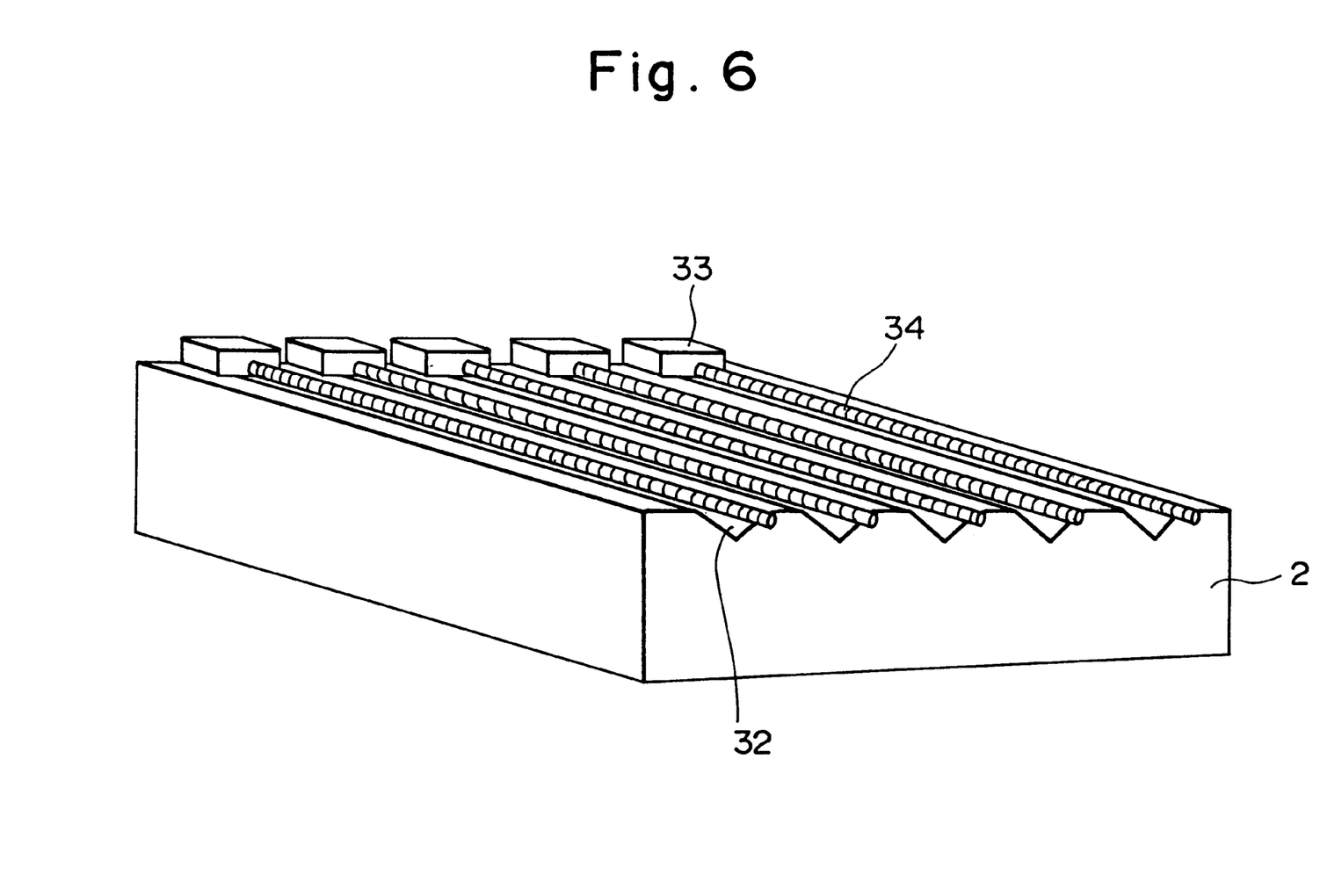
FIG. 6 is a perspective view of a modification of the diamond heat sink of the fourth embodiment.

According to the fourth embodiment, the alignment for mounting the element 31 on the insulation layer 2a was facilitated by processing the surface of the insulation 2a corresponding to the shape of the element 31. For example, when the element 31 is a LD, the LD and optical fibers connected to the LD can be easily positioned and fixed by wedge-shaped grooves. That is, as shown in FIG. 6, LD chips 33 and optical fibers 34 having wedge-shaped contact portions are aligned, positioned and fixed by a plurality of grooves 32 having wedge-shaped contact portions on the surface of the insulation layer 2. Thus, in this embodiment, the element can be easily mounted and the assembly can be facilitated.

The diamond heat sink described above comprises only a thermistor. However, as in the third embodiment, the heat sink may include both the thermistor and a Peltier element. In this case, the heat sink of the fourth embodiment can attain the equivalent effects as obtained in the third embodiment, as well as the effects in the fourth embodiment described above. Further, in the heat sink of the fourth embodiment, the electrodes 5a and 5b directly contact to the heat sensitive layer 3. However, as in the second embodiment, a highly doped layer for creating Ohmic contacts may be disposed between the electrodes 5a and 5b and the heat sensitive layer 3. In this case, the contact resistance of the electrodes 5a and 5b can be reduced as in the second embodiment, as well as attaining the equivalent effects obtained in the fourth embodiment.

Figure 7A:
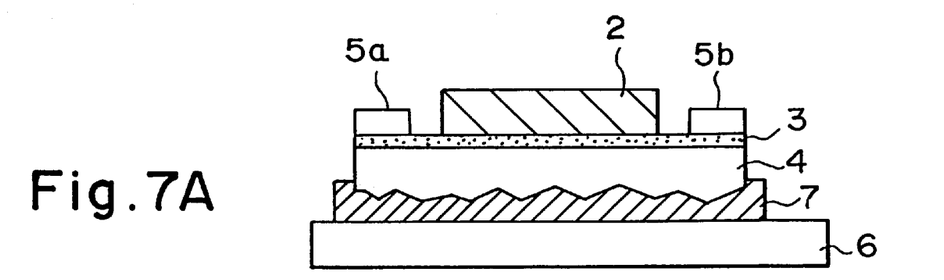
FIGS. 7A–7C illustrate a cross sectional view of an alternative diamond heat sink containing a thermistor and a Peltier element of a fourth embodiment, respectively.
Figure 7B:
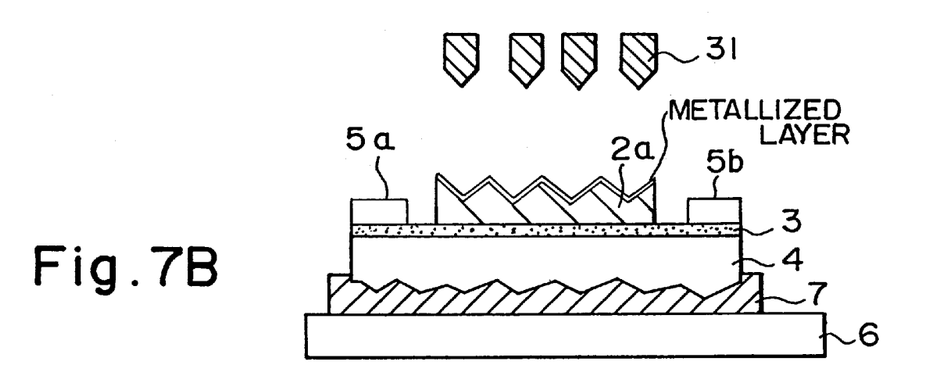
Figure 7C:
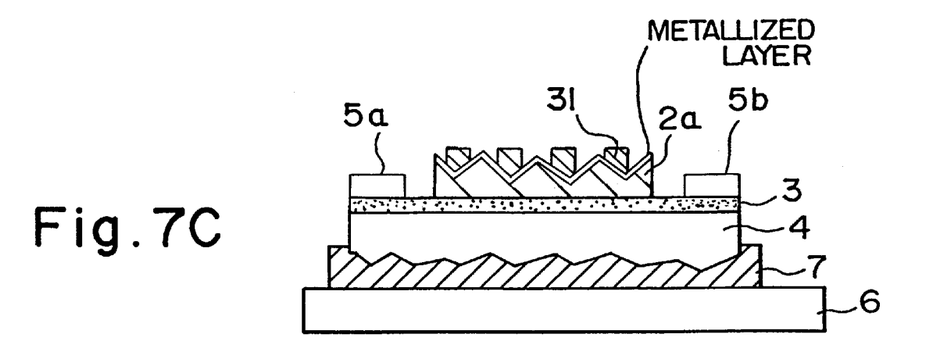

FIGS. 7A to 7C illustrate alternative heat sink according to the present embodiment. The heat sink according to the present invention may further comprise metallized layer, which is formed on or covered over the insulation layer 2a, as shown in FIG. 7B. The surface of the insulation layer 2 of the heat sink shown in FIG. 7A, which is absolutely the same as one shown in FIG. 5A, was processed and then metal layer of Ti/Pt/Mo was formed onto the processed surface of the insulation layer (FIG. 7B). Then the exothermal elements 31 were placed onto the wedge-shaped surface of the metallized layer, as shown in FIG. 7C. The metallized layer may consist of Ti/Mo/Au or of gold-tin. As shown in FIG. 7C, the exothermal elements 31 suitably fitted to the wedge-shaped surface of the metallized layer, resulting in the improvement on the heat transfer and the alignment, as described in the previous example of the present embodiment.

EXAMPLE 5

In the fifth embodiment, a heat sink having thermistor in the opposite side to the surface for placing exothermal element was prepared by the same steps as described in the fourth embodiment, other than the steps in which the surface of the insulation layer is metallized with Ti/Pt/Au and gold-tin in order. A part of the steps in the fifth embodiment is shown in FIGS. 8A to 8G.

Figure 8A:
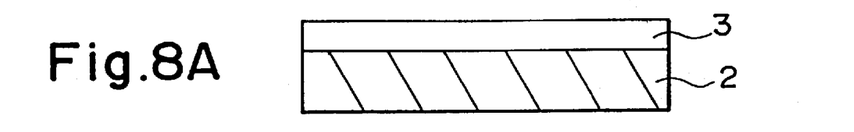
FIGS. 8A–8G illustrate a cross sectional view of a diamond heat sink containing a thermistor of the fifth embodiment, respectively. The figures illustrates the manufacturing steps of the fifth embodiment according to the present invention.
Figure 8B:
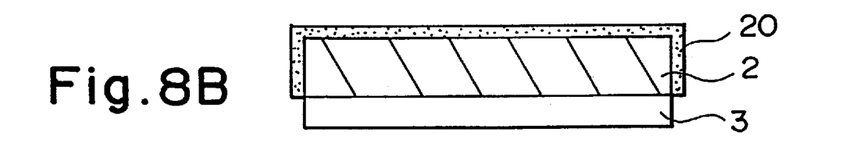
Figure 8C:
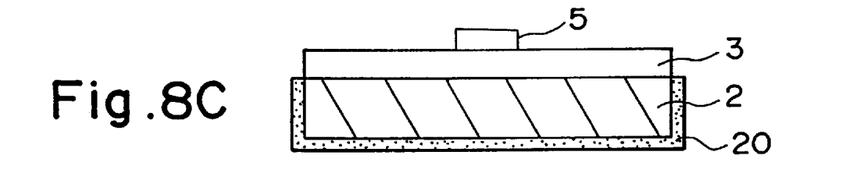
Figure 8D:
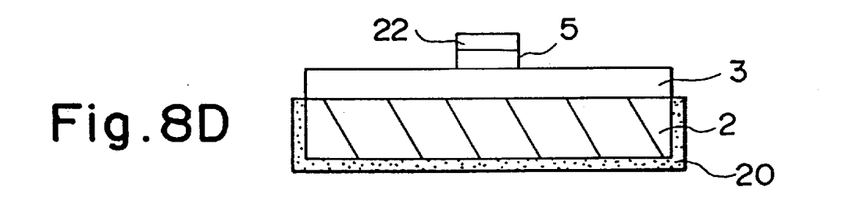
Figure 8E:
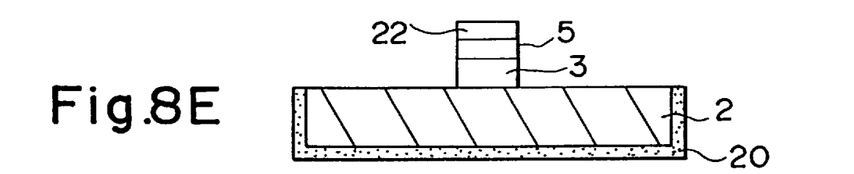
Figure 8F:
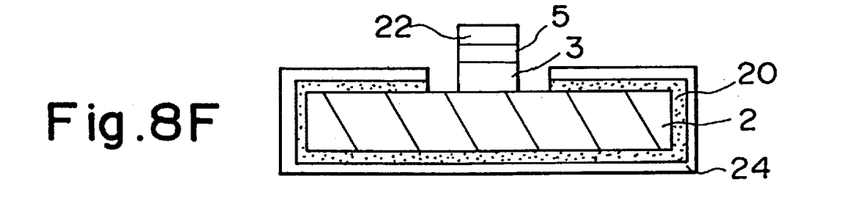

The heat sensitive layer of the doped diamond 3 was deposited on the insulation layer of the undoped diamond 2 (FIG. 8A). The substrate was then turned upside down, and the metal layer 20 consisting of Ti/Pt/Au was formed on the upper surface and the side edge of the insulation layer (FIG. 8B). The metal layer of Ti/Pt/Au was formed as an intermediate layer between a diamond and the gold-tin layer, for the purpose of improvement on the adhesion of diamond with gold-tin. The substrate was again turned around to recover in the initial position, and the electrode was formed on the exposed surface of the heat sensitive layer 3 (FIG. 8C). An aluminum layer 22 for etch masking was formed on the electrode 5 (FIG. 8C), and the unmasked portion of the heat sensitive layer 3 was then removed by reactive ion etching (FIG. 8D). The upper surface of the insulation layer 2 was also coated with the Ti/Pt/Au, and the entire Ti/Pt/Au layer 20 was covered with gold-tin layer 24 (FIG. 8F).

Figure 8G:
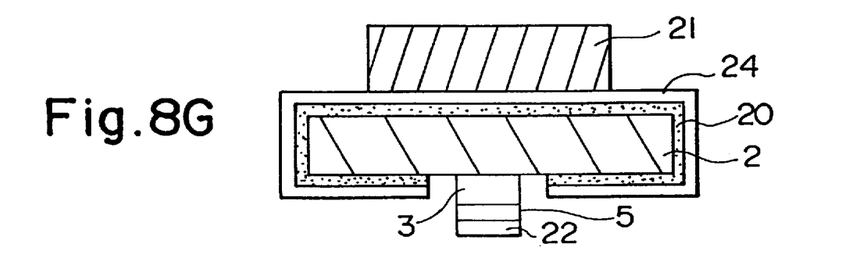

The heat sink have a thermistor, which consists of insulation layer 2, heat sensitive layer 3 and electrode 5. The exothermal element should be placed on the metallized surface opposite the thermistor (FIG. 8G).

In place of inserting the Ti/Pt/Au layer between diamond and gold-tin, the insulation layer 2 can be metallized with a Ti/Mo/Au layer.

As mentioned before, according to the present invention, the exotherms from the element mounted on the insulation layer is transferred through the insulation layer to the heat sensitive layer. The heat is then transferred to the support layer, and is finally released to the atmosphere at the support layer. Since the insulation layer, the heat sensitive layer and the support layer are made of diamond having excellent heat conductivity, the heat from the element on the insulation layer can promptly be transferred to the support layer. Also, since the thermal response rate of the thermistor composed of the heat sensitive layer made of diamond is high, the resistance of the heat sensitive layer between the electrodes instantly becomes the value responsive to the temperature of the element mounted on the insulation layer. Moreover, since the thermal capacity of the insulation layer is small, most of the heat from the element placed on the insulation layer is transferred to the heat sensitive layer. Thus, the temperature of the element on the insulation layer is highly precisely and simultaneously measured, allowing precise controlling of the operation of the mounted element.

Furthermore, according to the present invention, diamond which is formed or deposited by vapor phase synthetic process such as CVD can be used as the heat sink substrate without surface polishing process, and thus the manufacturing cost is considerably reduced.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 182380/1994 (6-182380) filed on August 3 is hereby incorporated by reference.

What is claimed is:

1. A method for manufacturing a diamond heat sink comprising:
   (a) forming a substantially undoped diamond on a substantially flat surface of a substrate via vapor phase synthesis so that an insulation layer of the undoped diamond is formed on the substrate;
   (b) forming a doped diamond on the insulation layer via vapor phase synthesis so that a heat sensitive layer of the doped semiconductor diamond is formed on the insulation layer;
   (c) forming a substantially undoped diamond on the heat sensitive layer via vapor phase synthesis so that a support layer of the undoped diamond is formed on the heat sensitive layer;
   (d) removing the substrate so that the substantially flat surface of the insulation layer is exposed;
   (e) selectively removing a predetermined part of the exposed surface of the insulation layer so that the predetermined area of the surface of the heat sensitive layer is exposed; and
   (f) forming electrodes on the surface of the exposed heat sensitive layer.

2. A method for manufacturing a diamond heat sink according to claim 1, which further includes a step of forming a cooling element on said support layer, said step of forming a cooling element being carried out after said step of (c) forming a substantially undoped diamond on the heat sensitive layer.

3. A method for manufacturing a diamond heat sink according to claim 1, which further includes:
   a step of selectively forming a first metal layer on said support layer;
   selectively forming a p-type semiconductor layer and an n-type semiconductor layer each of which contacts with the first metal layer at one end, respectively; and
   selectively forming a second metal layer and a third metal layer each of which contacts with said p-type semiconductor layer and said n-type semiconductor layer at the other end.

4. A method for manufacturing a diamond heat sink according to claim 1, wherein said vapor phase synthesis is chemical vapor deposition.

5. A method for manufacturing a diamond heat sink according to claim 1, further comprising:
   patterning the surface of the insulation layer so that the patterned surface of the insulation layer is partially conformal to the shape of an exothermal element.

6. A method for manufacturing a diamond heat sink according to claim 5, further comprising:
   forming a metallized layer over the patterned surface of the insulation layer, said metallized layer being also partially conformal to the shape of the exothermal element.

7. A method for manufacturing a diamond heat sink, comprising:
   (a) forming a heat sensitive layer of a doped diamond on an insulating layer of a substantially undoped diamond via vapor phase synthesis;
   (b) forming a first metal layer to cover the exposed surface of the insulating layer;
   (c) forming an electrode on the exposed surface of the heat sensitive layer;
   (d) forming a second metal layer on the electrode;
   (e) partially removing the heat sensitive layer which is not covered with the electrode; and
   (f) forming a third metal layer on the entire surface of the first metal layer.

* * * * *